(12) United States Patent
Song (10) Patent No.: US 10,224,462 B2
(45) Date of Patent: Mar. 5, 2019

(54) LIGHT-EMITTING DEVICE (71) Applicant: LG INNOTEK CO., LTD., Seoul (KR)

(72) Inventor: June O. Song, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 290 days.

(21) Appl. No.: 14/339,205

(22) Filed: Jul. 23, 2014

(65) Prior Publication Data

US 2014/0332803 A1 Nov. 13, 2014

Related U.S. Application Data (63) Continuation of application No. 12/936,298, filed as application No. PCT/KR2009/001764 on Apr. 6, 2009, now Pat. No. 8,816,370.

(30) Foreign Application Priority Data

Apr. 5, 2008 (KR) .................. 10-2008-0031909

(51) Int. Cl.
*H01L 33/44* (2010.01)
*H01L 33/58* (2010.01)
(Continued)

(52) U.S. Cl.
CPC .............. *H01L 33/44* (2013.01); *H01L 33/58* (2013.01); *H01L 33/06* (2013.01); *H01L 33/12* (2013.01);
(Continued)

(58) Field of Classification Search
CPC ....... H01L 33/22; H01L 33/44; H01L 33/405; H01L 33/38; H01L 2933/0025; H01L 2933/0016; H01L 2933/0091
See application file for complete search history.

(56) References Cited

U.S. PATENT DOCUMENTS 5,557,115 A 9/1996 Shakuda
2002/0117672 A1 8/2002 Chu et al.
(Continued)

FOREIGN PATENT DOCUMENTS

EP 1 569 282 A2 8/2005
JP 11-251685 9/1999
(Continued)

OTHER PUBLICATIONS

Chinese Office Action dated Feb. 5, 2013 for Application 200980116966.9.
(Continued)

*Primary Examiner* — Yu Chen
(74) *Attorney, Agent, or Firm* — KED & Associates, LLP (57) ABSTRACT

Disclosed is a light emitting device. The light emitting device includes a light emitting semiconductor layer including a first conductive semiconductor layer, an active layer on the first conductive semiconductor layer and a second conductive semiconductor layer on the active layer. A passivation layer is disposed on a surface of a light emitting semiconductor layer. A first electrode layer is disposed on the first conductive semiconductor layer and a second electrode layer is disposed on the second conductive semiconductor layer. Plurality of protrusion parts are disposed on a top surface of the first conductive semiconductor layer.

10 Claims, 3 Drawing Sheets

(51) Int. Cl.
*H01L 33/22* (2010.01)
*H01L 33/06* (2010.01)
*H01L 33/40* (2010.01)
*H01L 33/46* (2010.01)
*H01L 33/12* (2010.01)

(52) U.S. Cl.
CPC ............ *H01L 33/22* (2013.01); *H01L 33/405* (2013.01); *H01L 33/46* (2013.01); *H01L 2933/0091* (2013.01)

(56) References Cited

U.S. PATENT DOCUMENTS

| | | |
|---|---|---|
| 2004/0061433 A1 | 4/2004 | Izuno et al. |
| 2005/0093008 A1 | 5/2005 | Suehiro et al. .................. 257/98 |
| 2005/0199887 A1 | 9/2005 | Suehiro et al. .................. 257/79 |
| 2005/0236632 A1 | 10/2005 | Lai et al. |
| 2005/0255614 A1* | 11/2005 | Jonda ...................... H01L 33/38 438/21 |
| 2005/0277218 A1 | 12/2005 | Nakajo et al. |
| 2006/0027815 A1 | 2/2006 | Wierer, Jr. et al. ............. 257/79 |
| 2006/0060874 A1 | 3/2006 | Edmond et al. ................. 257/98 |
| 2006/0145170 A1 | 7/2006 | Cho ................. 257/95 |
| 2006/0267042 A1 | 11/2006 | Izuno et al. |
| 2007/0272933 A1 | 11/2007 | Kim et al. ...................... 257/94 |
| 2008/0135868 A1 | 6/2008 | Okagawa et al. ............. 257/99 |
| 2008/0258161 A1* | 10/2008 | Edmond ................. H01L 33/42 257/98 |
| 2009/0026475 A1 | 1/2009 | Yamaguchi et al. |
| 2009/0052159 A1 | 2/2009 | Abe et al. ....................... 362/84 |
| 2010/0038669 A1* | 2/2010 | McKenzie ...................... 257/98 |
| 2010/0203661 A1* | 8/2010 | Hodota ............... H01L 33/0079 438/29 |
| 2010/0213485 A1* | 8/2010 | McKenzie et al. ............. 257/98 |

FOREIGN PATENT DOCUMENTS

| | | |
|---|---|---|
| JP | 2000-58911 A | 2/2000 |
| JP | 2005-191514 | 7/2005 |
| JP | 2007-073789 | 3/2007 |
| JP | 2007-184313 A | 7/2007 |
| KR | 10-2007-0113406 | 11/2007 |
| TW | M 255518 U | 1/2005 |
| WO | WO 2006/038665 | 4/2006 |
| WO | WO 2007/029859 | 3/2007 |
| WO | WO 2007/089460 | 8/2007 |

OTHER PUBLICATIONS

International Search Report issued in PCT/KR2009/001764 dated Dec. 14, 2009.
European Search Report issued in application No. 09754967.9 dated Feb. 16, 2015.
Chinese Office Action dated Apr. 29, 2016 issued in Application No. 201410136673.X.

* cited by examiner

LIGHT-EMITTING DEVICE

CROSS-REFERENCE TO RELATED APPLICATIONS

This application is a Continuation of co-pending U.S. patent application Ser. No. 12/936,298, filed on Oct. 4, 2010 which is a U.S. National Stage of PCT/KR2009/001764 filed on Apr. 6, 2009, which claims priority from Korean Patent Application No. 10-2008-0031909 filed on Apr. 5, 2008, whose entire disclosures are hereby incorporated by reference.

TECHNICAL FIELD

The embodiment relates to a light emitting device.

BACKGROUND ART

Recently, a light emitting diode (LED) is spotlighted as a light emitting device. Since the LED can convert electric energy into light energy with high efficiency and long life span of about 5 years or more, the LED can remarkably reduce the energy consumption and repair and maintenance cost. In this regard, the LED is spotlighted in the next-generation lighting field.

Such an LED is prepared as a light emitting semiconductor layer including a first conductive semiconductor layer, an active layer and a second conductive semiconductor layer, in which the active layer generates light according to current applied thereto through the first and second conductive semiconductor layers.

Meanwhile, since a material constituting the light emitting semiconductor layer has a refractive index lower than that of external air, light generated from the active layer is not effectively emitted to the outside, but totally reflected from a boundary surface and extinguished at an inside of the light emitting semiconductor layer.

To solve this problem, a concave-convex light extracting structure is formed on the first conductive semiconductor layer or the second conductive semiconductor layer provided at one side of the active layer. However, the electrical characteristics of the LED may be degraded due to the light extracting structure.

DISCLOSURE

Technical Problem

The embodiment provides a light emitting device having a novel structure and a method of manufacturing the same.

The embodiment provides a light emitting device capable of improving the electrical characteristic and light extraction efficiency and a method of manufacturing the same.

Technical Solution

According to the embodiment, a light emitting device includes a first conductive semiconductor layer, an active layer on the first conductive semiconductor layer, a second conductive semiconductor layer on the active layer, a passivation layer surrounding the first conductive semiconductor layer, the active layer, and the second conductive semiconductor layer, a first light extracting structure layer having a concave-convex structure on the passivation layer, a first electrode layer electrically connected to the first conductive semiconductor layer through the passivation layer and the first light extracting structure layer, and a second electrode layer electrically connected to the second conductive semiconductor layer through the passivation layer and the light extracting structure layer.

According to the embodiment, the light emitting device includes a support substrate, a second conductive semiconductor layer on the support substrate, an active layer on the second conductive semiconductor layer, a first conductive semiconductor layer on the active layer, a passivation layer surrounding the second conductive semiconductor layer, the active layer, and the first conductive semiconductor layer, a light extracting structure layer having a concave-convex structure on the passivation layer, and a first electrode layer formed on the first conductive semiconductor layer through the passivation layer and the light extracting structure layer.

Advantageous Effects

The embodiment can provide a light emitting device having a novel structure and a method of manufacturing the same.

The embodiment can provide a light emitting device capable of improving the electrical characteristic and light extraction efficiency and a method of manufacturing the same.

BEST MODE

Mode for Invention

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings.

The thickness and size of each layer shown in the drawings may be exaggerated, omitted or schematically drawn for the purpose of convenience or clarity. In addition, the size of elements does not utterly reflect an actual size.

Figure 1:
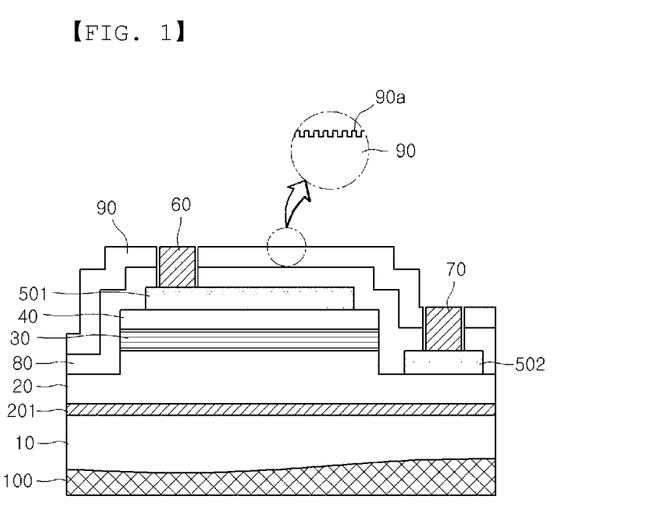
FIG. 1 is a sectional view showing a light emitting device according to a first embodiment.

FIG. 1 is a sectional view showing a light emitting device according to the first embodiment.

Referring to FIG. 1, a buffer layer 201 is formed on a growth substrate 10, and a light emitting semiconductor layer including a first conductive semiconductor layer 20, an active layer 30, and a second conductive semiconductor layer 40 is formed on the buffer layer 201.

The light emitting semiconductor layer is partially removed through MESA etching, and a first current spreading layer 502 is formed on the first conductive semiconductor layer 20 exposed through the MESA etching. In addition, a second current spreading layer 501 is formed on a second conductive semiconductor layer 40.

A passivation layer 80 surrounds the light emitting semiconductor layer and the first and second current spreading layers 502 and 501, and a first light extracting structure layer 90 having a concave-convex structure 90a is formed on the passivation layer 80.

Then, the first light extracting structure layer 90 and the passivation layer 80 are selectively removed, so that first and second electrode layers 70 and 60 are formed on the first and second current spreading layers 502 and 501, respectively.

In addition, a reflective layer 100 is formed below the growth substrate 10.

In more detail, for example, the growth substrate 10 may include one of Al2O3, SiC, Si, AlN, GaN, AlGaN, glass and GaAs.

Before the first conductive semiconductor layer 20 is grown, the buffer layer 201 is formed on the growth substrate 10. For instance, the buffer layer 201 may include at least one of InGaN, AlN, SiC, SiCN, and GaN.

The light emitting semiconductor layer including the first conductive semiconductor layer 20, the active layer 30, and the second conductive semiconductor layer 40 may include group-III nitride-based semiconductor materials. For example, the first conductive semiconductor layer 20 may include a gallium nitride layer including n type impurities such as Si, and the second conductive semiconductor layer 40 may include a gallium nitride layer including p type impurities such as Mg or Zn. In addition, the active layer 30, which generates light through the recombination of electrons and holes, may include one of InGaN, AlGaN, GaN, and AlInGaN. The wavelength of light emitted from the light emitting device is determined according to the type of materials constituting the active layer 30.

The active layer 30 and the second conductive semiconductor layer 40 are formed on a part of the first conductive semiconductor layer 20. In other words, the part of the first conductive semiconductor layer 20 makes contact with the active layer 30.

Although not shown, an interface modification layer may be further formed on the second conductive semiconductor layer 40.

The interface modification layer may include a superlattice structure, one of InGaN, GaN, AlInN, AlN, InN, and AlGaN doped with first conductive impurities, one of InGaN, GaN, AlInN, AlN, InN, and AlGaN doped with second conductive impurities, or one of group III nitride-based elements having nitrogen-polar surfaces. In particular, the interface modification layer having the superlattice structure may include a nitride or a carbon nitride including group II, III, or IV elements.

The first current spreading layer 502 is partially formed on the first conductive semiconductor layer 20, and the second current spreading layer 501 is partially or wholly formed on the second conductive semiconductor layer 40.

Both of the first and second current spreading layers 502 and 501 may not be necessarily required. That is, at least one of the first and second current spreading layers 502 and 501 may be omitted.

The first and second current spreading layers 502 and 501 can be prepared as a single layer structure or a multi-layer structure including at least one selected from the group consisting of ITO (indium tin oxide), doped ZnO (doped Zinc oxide), TiN (titanium nitride), IZO (indium zinc oxide), IZTO (indium zinc tin oxide), NiO (nickel oxide), RuO2 (ruthenium oxide), IrO2 (iridium oxide), doped In2O3 (doped indium oxide), Au, Ag, doped SnO2 (doped tin oxide), GITO (gallium indium tin oxide), PdO (palladium oxide), PtO (platinum oxide), Ag2O (silver oxide), and doped TiO2 (doped titanium oxide).

The first and second current spreading layers 502 and 501 uniformly spread current applied to the first and second conductive semiconductor layers 20 and 40, thereby improving light emitting efficiency. In addition, the first and second current spreading layers 502 and 501 allow the first and second electrode layers 70 and 60 to be sufficiently bonded to the first and second conductive semiconductor layers 20 and 40, respectively.

The passivation layer 80 is formed on the light emitting semiconductor layer including the first and second current spreading layers 502 and 501 except for some portions of the first and second current spreading layers 502 and 501. The passivation layer 80 prevents the light emitting device from being physically, chemically, or electrically damaged.

The passivation layer 80 includes a transparent electric insulating material. For example, the passivation layer 80 includes at least one of SiO2 (silicon dioxide), SiNx (silicon nitride), MgF2 (magnesium fluoride), Cr2O3 (chromium oxide), Al2O3 (aluminum oxide), TiO2, ZnS (zinc sulfide), ZnO (zinc oxide), CaF2 (calcium fluoride), AlN (aluminum nitride), and CrN (chromium nitride).

The first light extracting structure layer 90 is provided on the passivation layer 80. The first light extracting structure layer 90 is selectively removed such that portions of the first and second current spreading layers 502 and 510 are exposed similarly to the passivation layer 80.

The first light extracting structure layer 90 may include a material having high light transmissivity and can be prepared as a surface material layer having a negative polarity such that the concave-convex structure 90a such as a cylindrical structure or a conical structure can be formed on the surface of the first light extracting structure layer 90 through CVD (Chemical Vapor Deposition) and PVD (Physical Vapor Deposition) or a wet etching process using an acid/base solution.

For example, the first light extracting structure layer 90 may include group II-VI compounds including ZnO or MgZnO, or group III-V compounds including GaN or AlN. The first light extracting structure layer 90 may include hexagonal crystalline material. In addition, the first light extracting structure layer 90 may include TiO2 or Al2O3.

The first light extracting structure layer 90 is provided on the passivation layer 80 to improve light extraction efficiency while preventing the electrical characteristic of the light emitting semiconductor layer from being degraded.

The first electrode layer 70 is formed on a part of the first current spreading layer 502. If the first current spreading layer 502 is omitted, the first electrode layer 70 may make contact with the first conductive semiconductor layer 20.

In order to form an interface having a superior adhesive property with respect to the first conductive semiconductor layer 20 or the first current spreading layer 502, the first electrode layer 70 may include a material forming an ohmic contact interface with respect to the first conductive semiconductor layer 20 or the first current spreading layer 502. For example, the first electrode layer 70 may include one selected from the group consisting of Ti, Al, Cr, V, Au, and Nb. In addition, the first electrode layer 70 can be formed by using silicide.

The second electrode layer 60 is formed on a part of the second current spreading layer 501.

The second electrode layer 60 may include a material forming an interface representing a superior adhesive property or a schottky contact interface representing a superior adhesive property with respect to the second current spreading layer 501. For example, the second electrode layer 60 may include at least one selected from the group consisting of Ni, Al, Cr, Cu, Pt, Au, Pd, ITO, ZnO, ZITO, TiN, and IZO. In addition, the second electrode layer 60 can be formed by using silicide.

The reflective layer 100 is formed below the growth substrate 10, and includes a material having a high reflective rate. For example, the reflective layer 100 may include at least one of Ag, Al, Rh, Pd, Ni, Au, a DBR (Distributed Bragg Reflector), and an ODR (Omni-Directional Reflector)

The reflective layer 100 reflects light directed downward beyond the growth substrate 10, so that the light emitting efficiency of the light emitting device can be improved.

Figure 2:
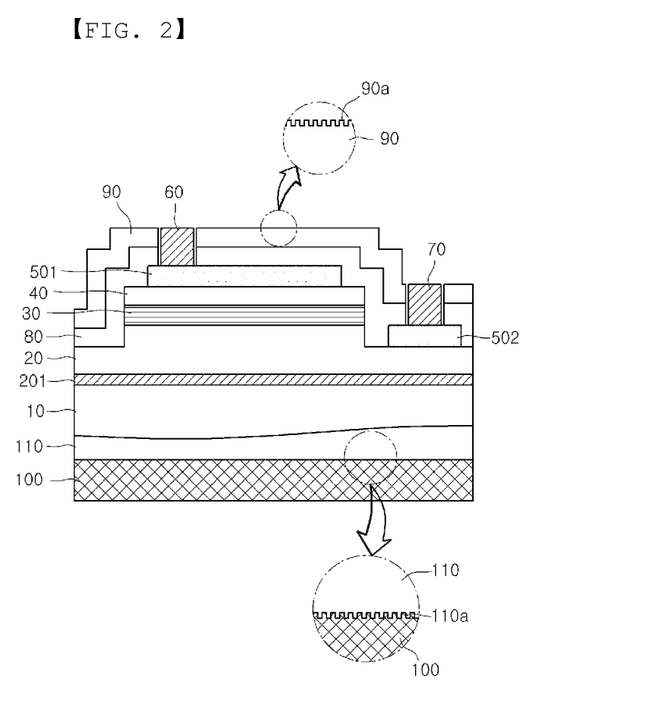
FIG. 2 is a sectional view showing a light emitting device according to a second embodiment.

FIG. 2 is a sectional view showing a light emitting device according to a second embodiment.

The light emitting device according to the second embodiment has the structure similar to that of the light emitting device according to the first embodiment. Therefore, the following description will be focused on the difference from the light emitting device according to the first embodiment in order to avoid redundancy.

Referring to FIG. 2, the buffer layer 201 is formed on the growth substrate 10, and the light emitting semiconductor layer including the first conductive semiconductor layer 20, the active layer 30, and the second conductive semiconductor layer 40 is formed on the buffer layer 201.

The light emitting semiconductor layer is partially removed through a MESA etching process, and the first current spreading layer 502 is formed on the first conductive semiconductor layer 20 exposed through the MESA etching process. In addition, the second current spreading layer 501 is formed on the second conductive semiconductor layer 40.

The passivation layer 80 surrounds the light emitting semiconductor layer and the first and second current spreading layers 502 and 501, and the first light extracting structure layer 90 having the concave-convex structure 90*a* is formed on the passivation layer 80.

Then, the first light extracting structure layer 90 and the passivation layer 80 are selectively removed, so that the first and second electrode layers 70 and 60 are formed on the first and second current spreading layers 502 and 501, respectively.

A second light extracting structure layer 110 and the reflective layer 100 which have concave-convex structures 110*a* are formed below the growth substrate 10.

The second light extracting structure layer 110 allows light directed downward beyond the growth substrate 10 to be extracted to the reflective layer 100 so that the reflective rate of light in the reflective layer 100 can be improved.

The second light extraction layer 110 may include a material having high light transmissivity and include a surface material layer having a negative polarity such that the concave-convex structure 110*a* such as a cylindrical structure or a conical structure can be formed on the surface of the second light extraction layer 110 through CVD (Chemical Vapor Deposition) and PVD (Physical Vapor Deposition) or a wet etching process using an acid/base solution.

For example, the second light extracting structure layer 110 may include group II-VI compounds including ZnO or MgZnO, or group III-V compounds including GaN or AlN. The second light extracting structure layer 110 may include hexagonal crystalline material. In addition, the second light extracting structure layer 110 may include $TiO_2$ or $Al_2O_3$.

The second light extracting structure layer 110 is provided below the growth substrate 10 to improve light extraction efficiency while preventing the electrical characteristic of the light emitting semiconductor layer from being degraded.

Figure 3:
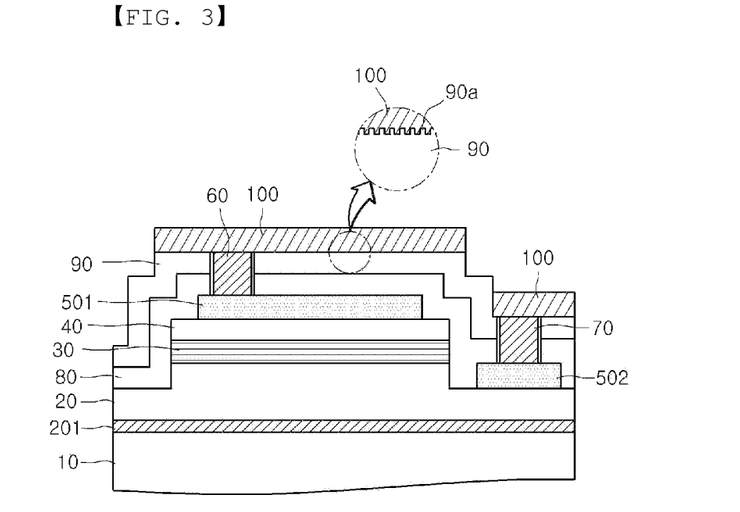
FIG. 3 is a sectional view showing a light emitting device according to a third embodiment.

FIG. 3 is a view showing a light emitting device according to a third embodiment.

The light emitting device according to the third embodiment has the structure similar to that of the light emitting device according to the first embodiment. Therefore, the following description will be focused on the difference from the light emitting device according to the first embodiment in order to avoid redundancy.

Referring to FIG. 3, the buffer layer 201 is formed on the growth substrate 10, and the light emitting semiconductor layer including the first conductive semiconductor layer 20, the active layer 30, and the second conductive semiconductor layer 40 is formed on the buffer layer 201.

The light emitting semiconductor layer is partially removed through a MESA etching process, and the first current spreading layer 502 is formed on the first conductive semiconductor layer 20 exposed through the MESA etching process. In addition, the second current spreading layer 501 is formed on the second conductive semiconductor layer 40.

The passivation layer 80 surrounds the light emitting semiconductor layer and the first and second current spreading layers 502 and 501, and the first light extracting structure layer 90 having the concave-convex structure 90*a* is formed on the passivation layer 80.

Then, the first light extracting structure layer 90 and the passivation layer 80 are selectively removed, so that the first and second electrode layers 70 and 60 are formed on the first and second current spreading layers 502 and 501, respectively.

The reflective layer 100 is formed on portions of the first electrode layer 70 and the first light extracting structure layer 90, and on portions of the second electrode layer 60 and the first light extracting structure layer 90.

The reflective layer 100 may include an electrical conductive material to electrically connect the first and second electrode layers 70 and 60 to the outside.

The reflective layer 100 allows the light from the active layer 30 to be emitted to the outside through the growth substrate 10. In other words, different from the light emitting device according to the first and second embodiments, the light emitting device according to the third embodiment emits the light from the active layer 30 to the outside mainly through the growth substrate 10.

Figure 4:
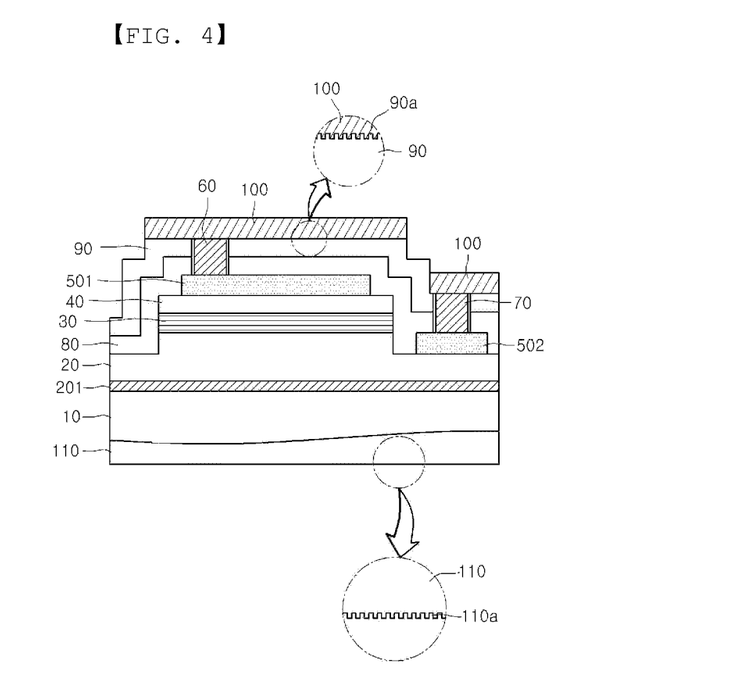
FIG. 4 is a sectional view showing a light emitting device according to a fourth embodiment.

FIG. 4 is a view showing a light emitting device according to the fourth embodiment.

The light emitting device according to the fourth embodiment has the structure similar to that of the light emitting device according to the third embodiment. Therefore, the following description will focused on the difference from the light emitting device according to the third embodiment in order to avoid redundancy.

Referring to FIG. 4, the buffer layer 201 is formed on the growth substrate 10, and the light emitting semiconductor layer including the first conductive semiconductor layer 20, the active layer 30, and the second conductive semiconductor layer 40 is formed on the buffer layer 201.

The light emitting semiconductor layer is partially removed through a MESA etching process, and the first current spreading layer 502 is formed on the first conductive semiconductor layer 20 exposed through the MESA etching process. In addition, the second current spreading layer 501 is formed on the second conductive semiconductor layer 40.

The passivation layer 80 surrounds the light emitting semiconductor layer and the first and second current spreading layers 502 and 501, and the first light extracting structure layer 90 having the concave-convex structure 90a is formed on the passivation layer 80.

Then, the first light extracting structure layer 90 and the passivation layer 80 are selectively removed, so that the first and second electrode layers 70 and 60 are formed on the first and second current spreading layers 502 and 501, respectively.

The reflective layer 100 is formed on portions of the first electrode layer 70 and the first light extracting structure layer 90, and on portions of the second electrode layer 60 and the first light extracting structure layer 90.

The reflective layer 100 may include an electrical conductive material to electrically connect the first and second electrode layers 70 and 60 to the outside.

The reflective layer 100 allows the light from the active layer 30 to be emitted to the outside through the growth substrate 10. In other words, different from the light emitting device according to the first and second embodiments, the light emitting device according to the fourth embodiment emits the light from the active layer 30 to the outside mainly through the growth substrate 10.

The second light extracting structure layer 110 having the concave-convex structure 110a is formed below the growth substrate 10. The second light extracting structure layer 110 allows light directed downward beyond the growth substrate 10 to be effectively extracted to the outside.

The second light extraction layer 110 may include a material having high light transmissivity and include a surface material layer having a negative polarity such that the concave-convex structure 110a such as a cylindrical structure or a conical structure can be formed on the surface of the second light extraction layer 110 through CVD (Chemical Vapor Deposition) and PVD (Physical Vapor Deposition) or a wet etching process using an acid/base solution.

For example, the second light extracting structure layer 110 may include group II-VI compounds including ZnO or MgZnO, or group III-V compounds including GaN or AlN. The light extracting structure 110 may include hexagonal crystalline material. In addition, the second light extracting structure layer 110 may include TiO2 or Al2O3.

The second light extracting structure layer 110 is provided below the growth substrate 10 to improve light extraction efficiency while preventing the electrical characteristic of the light emitting semiconductor layer from being degraded.

Figure 5:
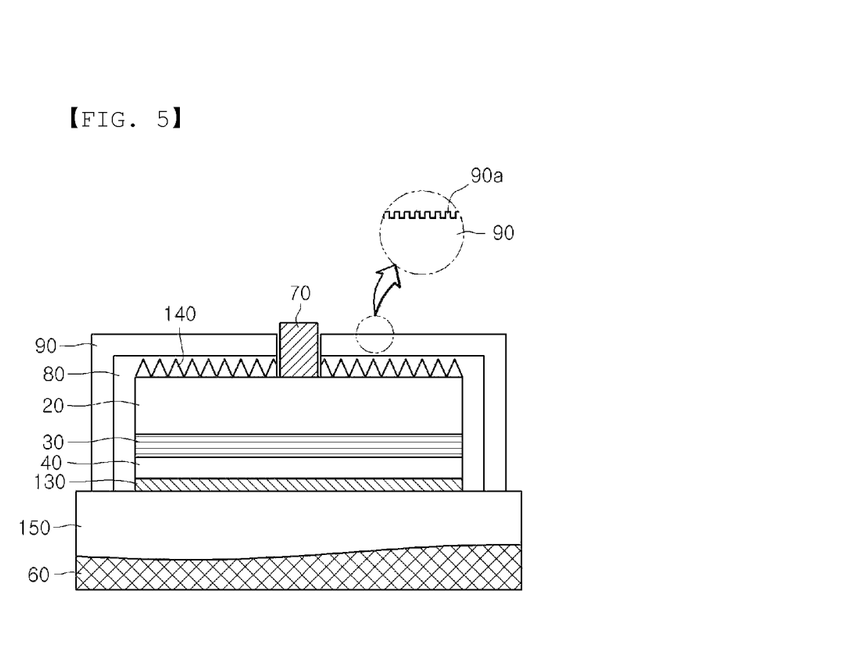
FIG. 5 is a view showing a light emitting device according to a fifth embodiment.

FIG. 5 is a view showing a light emitting device according to a fifth embodiment.

Different from the light emitting devices according to the first to fourth embodiments, the light emitting device according to the fifth embodiment includes a vertical type light emitting device to which the technical spirit of the present disclosure is applied as an example.

Referring to FIG. 5, a reflective ohmic contact current spreading layer 130 is formed on a support substrate 150, and the light emitting semiconductor layer including the first conductive semiconductor layer 20, the active layer 30, and the second conductive semiconductor layer 40 is formed on the reflective ohmic contact current spreading layer 130. In addition, a protrusion part 140 is formed on the first conductive semiconductor layer 20 to improve light extraction efficiency.

The passivation layer 80 surrounding the light emitting semiconductor layer is formed on top and lateral surfaces of the light emitting semiconductor layer, and the first light extracting structure layer 90 having the concave-convex structure 90a is formed on the passivation layer 80.

The passivation layer 80 and the light extracting structure layer 90 are selectively removed to expose a portion of the first conductive semiconductor layer 20, and the first electrode layer 70 is formed on the first conductive semiconductor layer 20.

Then, the second electrode layer 60 is formed below the support substrate 150.

In more detail, the support substrate 150, which is an electric conductive layer, may include a wafer substrate including at least one of Si, SiGe, ZnO, GaN, AlSiC, and GaAs, or may include metal, alloy, or solid solution including at least one of Cu, Ni, Ag, Al, Nb, Ta, Ti, Au, Pd, and W.

The support substrate 150 has the shape of a sheet, a disk, or a foil at a thickness in the range of about 5 µm to 1 mm. The support substrate 150 may be formed through an electro-plating scheme, a PVD scheme, or a CVD scheme.

The reflective ohmic contact current spreading layer 130 may include Ag, alloy containing Ag, solid solution containing Ag, Rh, alloy containing Rh, solid solution containing Rh, Al, alloy containing Al, solid solution containing Al, Pt, alloy containing Pt, solid solution containing Pt, Pd, alloy containing Pd, solid solution containing Pd, Au, alloy containing Au, solid solution containing Au, Ni, alloy containing Ni, solid solution containing Ni, or silicide such as Ag—Si, Rh—Si, Pd—Si, Ni—Si, Cr—Si, or Pt—Si.

The surface of the reflective ohmic contact current spreading layer 130 facing the support substrate 150 may include at least one of Ag, Au, Ni, Ti, and Cu providing a superior adhesive property.

The light emitting semiconductor layer including the first conductive semiconductor layer 20, the active layer 30, and the second conductive semiconductor layer 40 may include group-III nitride-based semiconductor materials. For example, the first conductive semiconductor layer 20 may include a gallium nitride layer including n type impurities such as Si, and the second conductive semiconductor layer 40 may include a gallium nitride layer including p type impurities such as Mg or Zn. In addition, the active layer 30, which generates light through the recombination of electrons and holes, may include one of InGaN, AlGaN, GaN, and AlInGaN. The wavelength of light emitted from the light emitting device is determined according to the type of materials constituting the active layer 30.

The protrusion part 140 may include a material identical to or different from that of the first conductive semiconductor layer 20. The protrusion part 140 may have an irregular pattern through a wet etching process, or may have a regular pattern through a lithography process.

The passivation layer 80 surrounds the light emitting semiconductor layer except for a region for the first electrode layer 70. The passivation layer 80 prevents the light emitting device from being physically, chemically, or electrically damaged.

The passivation layer 80 includes a transparent electric insulating material. For example, the passivation layer 80 includes at least one of SiO2, SiNx, MgF2, Cr2O3, Al2O3, TiO2, ZnS, ZnO, CaF2, AlN, and CrN.

The second light extraction layer 110 may include a material having high light transmissivity and include a surface material layer having a negative polarity such that the concave-convex structure 110a such as a cylindrical structure or a conical structure can be formed on the surface of the second light extraction layer 110 through CVD (Chemical Vapor Deposition) and PVD (Physical Vapor Deposition) or a wet etching process using an acid/base solution.

For example, the light extracting structure layer 90 may include group II-VI compounds including ZnO or MgZnO, or group III-V compounds including GaN or AlN. The light extracting structure layer 90 may include hexagonal crystalline material. In addition, the light extracting structure layer 90 may include TiO2 or Al2O3.

The first light extracting structure layer 90 is provided on the passivation layer 80 to improve light extraction efficiency while preventing the electrical characteristic of the light emitting semiconductor layer from being degraded.

The first electrode layer 70 is formed on a portion of the first conductive semiconductor layer 20. In order to form an interface representing a superior adhesive property with respect to the first conductive semiconductor layer 20, the first electrode layer 70 may include a material forming an ohmic contact interface with respect to the first conductive semiconductor layer 20. For example, the first electrode layer 70 may include one of Ti, Al, Cr, V, Ag, Rh, Au, Pd, and Nb.

The second electrode layer 60 is formed below the support substrate 60.

The second electrode layer 60 may include a material forming an interface having a superior adhesive property and an ohmic contact interface with respect to the support substrate 60. For example, the second electrode layer 60 may include at least one selected from the group consisting of Ni, Al, Cr, Cu, Ag, Al, Rh, Pt, Au, and Pd.

Although embodiments have been described with reference to a number of illustrative embodiments thereof, it should be understood that numerous other modifications and embodiments can be devised by those skilled in the art that will fall within the spirit and scope of the principles of this disclosure.

INDUSTRIAL APPLICABILITY

The embodiment is applicable to a light emitting device used as a light source.

What is claimed is:
1. A light emitting device comprising:
   a light emitting semiconductor layer including a first conductive semiconductor layer, an active layer on the first conductive semiconductor layer and a second conductive semiconductor layer on the active layer;
   a passivation layer disposed on a surface of the light emitting semiconductor layer;
   a light extracting structure layer on a top surface of the passivation layer and on lateral surfaces of the passivation layer, the light extracting structure layer includes a first material different from a second material of the passivation layer, wherein a concave-convex structure is provided on a top surface of the light extracting structure layer, the top surface of the light extracting structure layer faces away from the passivation layer;
   a first electrode layer disposed on a top surface of the first conductive semiconductor layer, the first electrode layer having a lateral surface, a top surface and a bottom surface;
   a support substrate disposed under a bottom surface of the second conductive semiconductor layer, the support substrate having a top surface and a bottom surface, the support substrate is an electric conductive layer having a wafer substrate including at least one of Si, SiGe, ZnO, GaN, AlSiC and GaAs;
   a current spreading layer disposed between the bottom surface of the second conductive semiconductor layer and the top surface of the support substrate;
   a plurality of protrusion parts disposed on the top surface of the first conductive semiconductor layer; and
   a second electrode layer disposed under the bottom surface of the support substrate, the second electrode layer including a material forming an interface having an adhesive property and an ohmic contact interface with respect to the support substrate, the second electrode layer being a different structure than the support substrate,
   wherein the plurality of protrusion parts include an identical material from the first conductive semiconductor layer,
   wherein the passivation layer includes a first portion disposed on the plurality of protrusion parts and a second portion disposed on lateral surfaces of the light emitting semiconductor layer,
   wherein the support substrate is electrically connected to the second electrode layer and the current spreading layer,
   wherein a width of the second electrode layer is wider than a width of the light emitting semiconductor layer in a horizontal direction, and
   wherein the bottom surface of the first electrode layer physically contacts the first conductive semiconductor layer,
   wherein the first portion of the passivation layer is disposed around the first electrode layer and is spaced apart from the lateral surface of the first electrode layer,
   wherein the lateral surface of the first electrode layer does not physically contact the first portion of the passivation layer, the lateral surface of the first electrode layer does not physically contact the light extracting structure layer, and the lateral surface of the first electrode layer faces a side surface of the first portion of the passivation layer,
   wherein the second portion of the passivation layer contacts the current spreading layer,
   wherein an entire area of the first electrode layer is formed of a metal and physically contacts the first conductive semiconductor layer,
   wherein the first conductive semiconductor layer and the second conductive semiconductor layer includes a nitride-based semiconductor material,
   wherein the side surface of the first portion of the passivation layer is spaced apart from the lateral surface of the first electrode layer,
   wherein the protrusion parts are not disposed between the side surface of the first portion of the passivation layer and the lateral surface of the first electrode layer,
   wherein the first material of the light extracting structure layer having a vertical side surface that is aligned with the side surface of the first portion of the passivation layer facing the lateral surface of the first electrode layer and a side surface of the protrusion parts, and
   the light emitting device comprising an exposed region of the first conductive semiconductor layer that is disposed at an area between the side surface of the first portion of the passivation layer and the lateral surface of the first electrode layer facing the first portion of the passivation layer.
2. The light emitting device of claim 1, wherein the first portion of the passivation layer includes a concave-convex structure contacting the plurality of protrusion parts, wherein the top surface of the first conductive semiconduc- tor layer includes the exposed region that is not overlapped in a vertical direction with the bottom surface of the first electrode layer and is not overlapped with the first portion of the passivation layer in the vertical direction.

3. The light emitting device of claim 2, wherein the passivation layer includes a transparent electric insulating material, and the current spreading layer includes a metal material.

4. The light emitting device of claim 1, wherein the second electrode layer directly contacts the support substrate, and the second electrode layer is formed of a metal.

5. The light emitting device of claim 1, wherein the passivation layer surrounds the current spreading layer.

6. A light emitting device comprising:
a support substrate formed of a conductive material, the support substrate having a top surface and a bottom surface, the support substrate is an electric conductive layer having a wafer substrate including at least one of Si, SiGe, ZnO, GaN, AlSiC and GaAs;
a light emitting semiconductor layer including a second conductive semiconductor layer on the support substrate, an active layer on the second conductive semiconductor layer, and a first conductive semiconductor layer on the active layer;
a plurality of protrusion parts disposed on the first conductive semiconductor layer and including an identical material from the first conductive semiconductor layer;
a passivation layer disposed on the first conducive semiconductor layer;
a light extracting structure layer on a top surface of the passivation layer and on lateral surfaces of the passivation layer, the light extracting structure layer includes a first material different from a second material of the passivation layer, wherein a concave-convex structure is provided on a top surface of the light extracting structure layer, the top surface of the light extracting structure layer faces away from the passivation layer;
a first electrode layer disposed on the first conductive semiconductor layer, the first electrode layer having a lateral surface, a top surface and a bottom surface;
a second electrode layer disposed under the bottom surface of the support substrate, the second electrode layer including a material forming an interface having an adhesive property and an ohmic contact interface with respect to the support substrate, the second electrode layer being a different structure than the support substrate,
a current spreading layer between the top surface of the support substrate and a bottom surface of the light emitting semiconductor layer,
wherein the passivation layer is disposed on top and lateral surfaces of the light emitting semiconductor layer,
wherein the first electrode layer is disposed on a portion of the first conductive semiconductor layer that is exposed through an open region of the passivation layer,
wherein the passivation layer includes a first portion disposed on the plurality of protrusion parts and a second portion disposed on the lateral surfaces of the light emitting semiconductor layer,
wherein the support substrate is electrically connected to the second conductive semiconductor layer, and
wherein the first electrode layer is electrically connected to the first conductive semiconductor layer,
wherein a width of the second electrode layer is wider than a width of the light emitting semiconductor layer in a horizontal direction,
wherein the first portion of the passivation layer has the open region on the first conductive semiconductor layer, and the first portion of the passivation layer is spaced apart from the first electrode layer,
wherein the bottom surface of the first electrode layer physically contacts the first conductive semiconductor layer at the open region,
wherein a width of the open region is greater than a width of the bottom surface of the first electrode layer,
wherein the lateral surface of the first electrode layer does not physically contact a side surface of the first portion of the passivation layer,
wherein an entire area of the first electrode layer is formed of a metal, and
wherein the first conductive semiconductor layer and the second conductive semiconductor layer includes a nitride-based semiconductor material,
wherein the protrusion parts at a bottom of the passivation layer is disposed spaced apart from the lateral surface of the first electrode layer,
wherein the first material of the light extracting structure layer having a vertical side surface that is aligned with the side surface of the first portion of the passivation layer facing the lateral surface of the first electrode layer and a side surface of the protrusion parts, and
the light emitting device comprising an exposed region of the first conductive semiconductor layer that is disposed at an area between the side surface of the first portion of the passivation layer and the lateral surface of the first electrode layer facing the first portion of the passivation layer.

7. The light emitting device of claim 6, wherein the current spreading layer contacts the second conductive semiconductor layer and includes at least one of Ag, alloy containing Ag, Ni, alloy containing Ni, Al, or alloy containing Al, wherein a surface of the current spreading layer facing the support substrate includes at least one of Ag, Au, Ni, Ti, and Cu.

8. The light emitting device of claim 6, wherein the first conductive semiconductor layer includes an n-type dopant, and the second conductive semiconductor layer includes a p-type dopant, wherein the support substrate includes a metal material and has a thickness in a range of 5 μm to 1 mm, wherein the top surface of the first conductive semiconductor layer includes the exposed region that is not overlapped in a vertical direction with the first electrode layer and is not overlapped with the first portion of the passivation layer in the vertical direction.

9. The light emitting device of claim 6, wherein the current spreading layer is formed of Ag material and the support substrate is formed of Si material, wherein a portion of the top surface of the first conductive semiconductor layer is exposed through the open region of the passivation layer.

10. The light emitting device of claim 6, wherein the light extracting structure layer includes one of ZnO, MgZnO, GaN, AlN, $TiO_2$ and $Al_2O_3$.

* * * * *